United States Patent
Schaffer et al.

(10) Patent No.: US 9,419,571 B2
(45) Date of Patent: Aug. 16, 2016

(54) PRECISION, HIGH VOLTAGE, LOW POWER DIFFERENTIAL INPUT STAGE WITH STATIC AND DYNAMIC GATE PROTECTION

(71) Applicant: XCELSEM, LLC, Santa Clara, CA (US)

(72) Inventors: Gregory L Schaffer, Cupertino, CA (US); Maarten Jeroen Fonderie, Santa Clara, CA (US)

(73) Assignee: XCELSEM, LLC, Santa Clara, CA (US)

( * ) Notice: Subject to any disclaimer, the term of this patent is extended or adjusted under 35 U.S.C. 154(b) by 0 days.

(21) Appl. No.: 14/840,289

(22) Filed: Aug. 31, 2015

(65) Prior Publication Data

US 2016/0079944 A1    Mar. 17, 2016

Related U.S. Application Data

(60) Provisional application No. 62/050,454, filed on Sep. 15, 2014.

(51) Int. Cl.
*H03F 3/45* (2006.01)
*H03F 1/52* (2006.01)

(52) U.S. Cl.
CPC ............ *H03F 3/45179* (2013.01); *H03F 1/523* (2013.01); *H03F 3/45475* (2013.01); *H03F 3/45* (2013.01); *H03F 2003/45008* (2013.01); *H03F 2200/444* (2013.01); *H03F 2203/30063* (2013.01); *H03F 2203/45154* (2013.01); *H03F 2203/45326* (2013.01); *H03F 2203/45352* (2013.01); *H03F 2203/45366* (2013.01)

(58) Field of Classification Search
CPC ....... H03F 3/45179; H03F 1/523; H03F 1/56; H03F 2203/45154; H03F 3/45475; H03F 2203/45366; H03F 2200/444; H03F 2203/45326; H03F 2203/45352; H03F 3/45
USPC ......................................... 330/252, 253, 261
See application file for complete search history.

(56) References Cited

U.S. PATENT DOCUMENTS

| 8,829,996 | B1 | 9/2014 | Schaffer | |
|---|---|---|---|---|
| 2008/0106335 | A1* | 5/2008 | Kimura | H03F 1/3211 330/253 |
| 2008/0272821 | A1* | 11/2008 | Miura | H03F 1/223 330/253 |
| 2010/0045379 | A1* | 2/2010 | Zhan | H03F 1/26 330/253 |

* cited by examiner

*Primary Examiner* — Khanh V Nguyen
(74) *Attorney, Agent, or Firm* — Gary Stanford; Huffman Law Group, PC

(57) ABSTRACT

A precision, high voltage, low power differential input stage including static and dynamic gate protection is disclosed herein. The differential input stage incorporates the performance of low voltage transistors with the high voltage capability of high voltage transistors. The transistors may be MOSFETs or the like. In addition, gate protection is provided to protect against large DC voltages and AC voltage transitions. The differential input stage includes a pair of input circuits, such as positive and negative input circuits, each including a cascode combination of low and high voltage transistors. In each cascode stage, the low voltage transistor is fabricated with a gate threshold voltage that is as high or higher than that of the high voltage transistors. The low voltage, high threshold transistors in the cascode stages may be configured to match each other. Resistors and capacitors may be provided to protect against excessive input current and voltage.

20 Claims, 4 Drawing Sheets

PRECISION, HIGH VOLTAGE, LOW POWER DIFFERENTIAL INPUT STAGE WITH STATIC AND DYNAMIC GATE PROTECTION

CROSS-REFERENCE TO RELATED APPLICATIONS

This application claims the benefit of U.S. Provisional Application Ser. No. 62/050,454, filed on Sep. 15, 2014, which is hereby incorporated by reference in its entirety for all intents and purposes.

BACKGROUND OF THE INVENTION

1. Field of the Invention

The present invention relates in general to differential input stages, and more particularly to a precision, low power, high voltage differential input stage, with incorporated protection against DC and fast AC transient signals at the input.

2. Description of the Related Art

It is desired to provide a precision, high voltage, low power input stage for analog amplifiers and comparators. Also, it is desired to provide gate protection for the transistors for large direct-current (DC) voltage differences, sudden large signal alternating-current (AC) transients, and protection against electrostatic discharge (ESD) pulses for both powered and unpowered circuits.

It is possible to fabricate high voltage differential input stages for amplifiers or comparators using lateral bipolar PNP transistors. Lateral bipolar PNP transistors do not need input protection because of their large base-emitter breakdown voltage. Lateral bipolar PNP transistors, however, are relatively slow, and separate ESD circuits are required to protect the inputs. Furthermore, the base current of a lateral bipolar PNP transistor shows up as input bias current, so that it is generally not suitable for low power applications. Moreover, high voltage lateral bipolar transistors are not commonly available in modern integrated circuit (IC) process manufacturing technologies.

Amplifier configurations using high voltage MOSFETs can be fast and have negligible input bias currents. But such configurations lack the DC precision that is achievable with bipolar designs. This is the result of the inherent poor matching of high voltage MOSFET transistors. Matching is the degree to which two devices behave exactly the same under identical operating conditions. Also, amplifier circuits built with high-voltage MOSFETs conventionally require gate protection circuits that further decrease the accuracy of the input stages.

SUMMARY OF THE INVENTION

A differential input stage as described herein includes first and second input circuits for converting a differential input voltage to an output. The output may be configured as a current or voltage and in either case may be singular or differential. Each input circuit includes three transistors, a current source and a resistor, in which the first and second input circuits are symmetrically configured relative to an intermediate node. Each of the transistors have a control terminal coupled to an internal input node, in which the resistor is coupled between the internal input node and an external input node. The current source sources bias current to a corresponding source node. One of the transistors has current terminals coupled between the corresponding source node and the intermediate node. The other two transistors are coupled in a cascode configuration (e.g., stacked) between the source node and an output node.

The upper cascode transistors of the first and second input circuits may be configured as lower voltage transistors as compared to the remaining transistors, which may be configured as higher voltage transistors. The lower voltage transistors, however, have threshold voltages that are at least as high or higher than the higher voltage transistors. The upper cascode transistors may also be configured to match each other. Capacitors may be provided to form a low pass filter at the internal inputs. Additional protection transistors or diodes may be provided in each of the input circuits, such as between the internal input and source nodes and between the internal input and a cascode node between the cascode transistors.

An amplifying device as described herein includes a differential input including a positive input node and a negative input node, first and second supply nodes, and a differential input stage as described above including first and second input circuits.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The present invention uses an improved design that incorporates the performance of low voltage MOSFETs with the high voltage capability of high voltage MOSFETs. In addition, gate protection is provided for the transistors to protect against large DC voltage differences, sudden large signal AC transients, and ESD pulses.

Embodiments described herein use a cascode combination of a low voltage MOSFET and a high voltage MOSFET. The gates of the low and high voltage MOSFETs are connected to each other to avoid increasing the complexity of, and to avoid degrading the performance of, the resulting circuit. Furthermore, the low voltage MOSFET is fabricated with a gate threshold voltage that is at least as high or higher than that of the high voltage MOSFET. In general, high voltage MOSFETs have higher gate threshold voltages than low voltage MOSFETs. A high threshold, low voltage MOSFET is added to the IC process manufacturing technology and used in the configuration.

Embodiments described herein provide high performance to high voltage analog amplifiers and comparators. This applies to low power circuits where MOSFETs have speed advantages over bipolar transistor designs operating at the same current level. The dynamic and static gate protection allows designs capable of operating at voltages far greater than the gate-to-source breakdown voltage, with very low input bias currents. High speed, low power, and precision are all achieved simultaneously. Also, MOSFET designs take up less space than bipolar designs. This leads to small die size and accompanying low die cost. Gate voltage DC protection circuit is improved by minimizing the required size of high voltage back-to-back MOSFETs.

Embodiments described herein have a performance that approaches that of the conventional differential input stage, in that the transconductance is less than 10% smaller than ideal. Furthermore, equivalent offset voltage error is about 10 times lower than with conventional high voltage FET designs. The embodiments described herein are particularly useful at very low currents where MOSFETs are in sub-threshold operation (in which their gate-source voltage is less than their threshold voltage). This allows circuit designs with supply currents well-below 1 microampere (μA).

Figure 1:
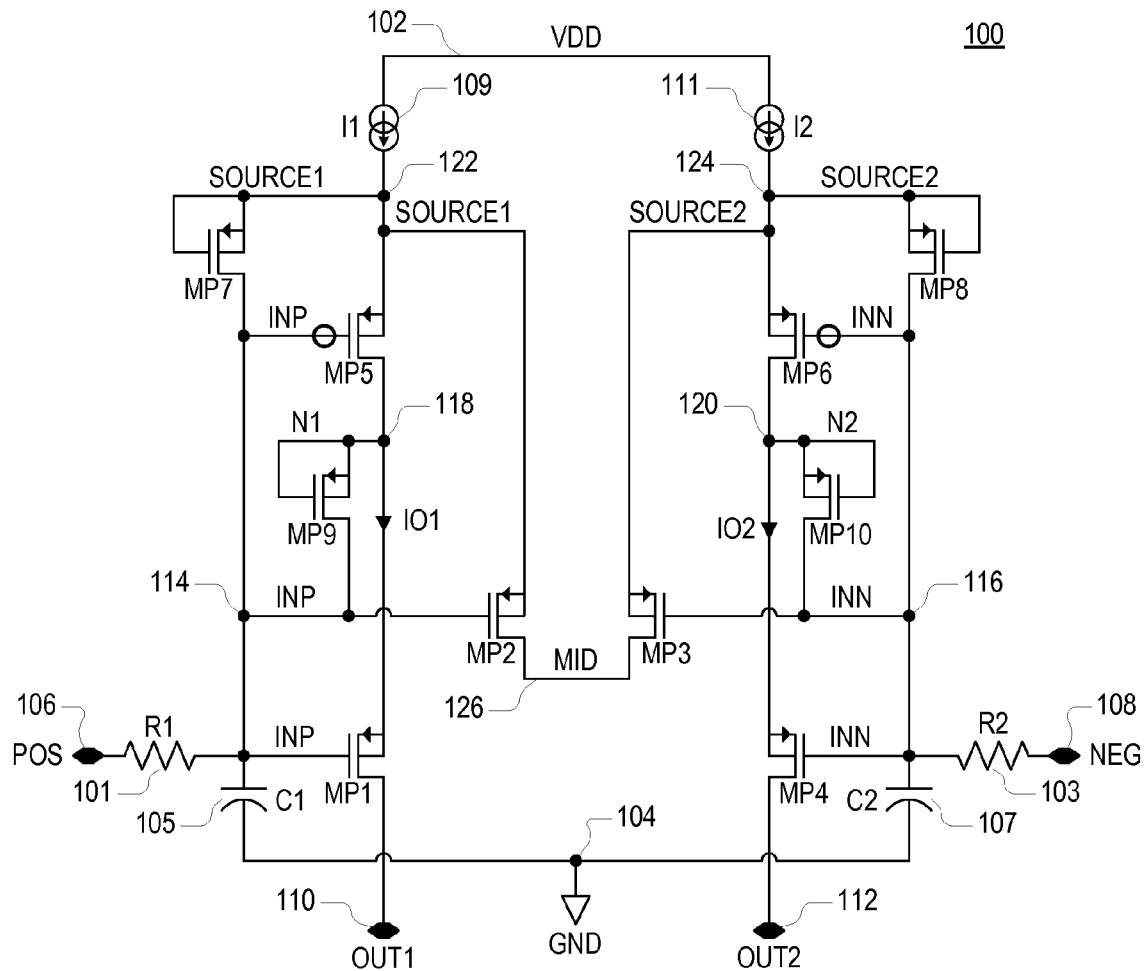
FIG. 1 is a schematic diagram of a precision, high voltage, low power MOSFET differential input stage implemented according to one embodiment of the present invention incorporating input gate protection.

FIG. 1 is a schematic diagram of a precision, high voltage, low power MOSFET differential input stage 100 implemented according to one embodiment of the present invention incorporating input gate protection. The differential input stage 100 is coupled between supply rails or nodes 102 and 104. The supply node 102 receives and provides a supply voltage VDD, which is any suitable supply voltage level. In one embodiment, VDD is 12V although other supply voltage levels are contemplated. The supply node 104 is a reference node with any suitable positive, negative or ground supply voltage level. In one embodiment, the supply node 104 is coupled to a reference supply voltage level, such as ground (GND) having a voltage level of 0 Volts (V). The differential input stage 100 includes a pair of input terminals 106 and 108 and a pair of output terminals 110 and 112. The input terminal 106 is shown receiving a positive input voltage POS and the input terminal 108 is shown receiving a negative input voltage NEG. The output terminal 110 is shown providing a first output voltage OUT1 and the output terminal 112 is shown providing a second output voltage OUT2. As understood by those of ordinary skill in the art, POS and NEG form a differential input voltage applied between the input nodes 106 and 108 and a corresponding differential output voltage OUT1 and OUT2 is developed across output nodes 110 and 112.

A resistor 101 with resistance R1 is coupled between node 106 and an internal positive input node 114 developing a voltage INP, and another resistor 103 with resistance R2 is coupled between node 108 and an internal negative input node 116 developing a voltage INN. A capacitor 105 with capacitance C1 is coupled between node 114 and supply node 104 (GND), and another capacitor 107 with capacitance C2 is coupled between node 116 and supply node 104 (GND). A first P-channel MOSFET MP1 has its source terminal coupled to a first internal cascode node 118 developing voltage N1, its gate terminal coupled to node 114, and its drain terminal coupled to the first output node 110 (OUT1). A second P-channel MOSFET MP2 has its source terminal coupled to a source node 122 developing a first source voltage SOURCE1, its gate terminal coupled to node 114, and its drain terminal coupled to an intermediate node 126 developing a voltage MID. A third P-channel MOSFET MP3 has its source terminal coupled to a second source node 124 developing a source voltage SOURCE2, its gate terminal coupled to node 116, and its drain terminal coupled to the intermediate node 126. A fourth P-channel MOSFET MP4 has its source terminal coupled to a second internal cascode node 120 developing voltage N2, its gate terminal coupled to node 116, and its drain terminal coupled to the second output node 112 (OUT2). A fifth P-channel MOSFET MP5 has its source terminal coupled to the first source node 122, its gate terminal coupled to node 114, and its drain terminal coupled to node 118. A sixth P-channel MOSFET MP6 has its source terminal coupled to the second source node 124, its gate terminal coupled to node 116, and its drain terminal coupled to node 120.

The differential input stage 100 further includes several protection P-channel MOSFETs MP7, MP8, MP9 and MP10. The source and gate terminals of MP7 are coupled together at the first source node 122, and its drain terminal is coupled to node 114. The source and gate terminals of MP8 are coupled together at the second source node 124, and its drain terminal is coupled to node 116. The source and gate terminals of MP9 are coupled together at node 118, and its drain terminal is coupled to node 114. The source and gate terminals of MP10 are coupled together at node 120, and its drain terminal is coupled to node 116. Each of the MOSFETs MP1-MP10 are shown having a substrate (or body) connection that is coupled to the source terminal of the corresponding transistor. A first bias current source 109 is coupled between the supply node 102 and the first source node 122 and sources a first bias current I1 to the first source node 122, and a second bias current source 111 is coupled between the supply node 102 and the second source node 124 and sources a second bias current I2 to the second source node 124.

The bias current sources 109 and 111 may each be implemented with one or more MOS, FET or MOSFET transistor devices. Each current source may include any suitable passive devices such as resistors and capacitors and the like depending upon the particular implementation. A separate bias current generator (not shown) may be included to generate a suitable bias current, in which the current sources 109 and 111 may be configured as, or otherwise include, current mirrors that mirror the bias currents into the positive and negative portions of the differential input stage 100. Alternative configurations are contemplated, such as charge pumps and the like. The bias currents I1 and I2 may be configured to substantially match each other, or otherwise be sufficiently close in current value. A low impedance exists between the source nodes 122 and 124 so that any effects of mismatch between the bias currents I1 and I2 is reduced by orders of magnitude. Also, the magnitude of the bias currents I1 and I2 may have a wide range without substantially affecting performance.

In response to a differential input voltage between POS and NEG at input nodes 106 and 108, current flows through the output nodes 110 and 112. The drain currents of MP1 and MP4 are shown as IO1 and IO2, respectively, flowing from the drains of MP5 and MP6 to the sources of MP1 and MP4, respectively.

The transistors MP1-MP4 are "high voltage" MOSFETs, whereas the transistors MP5-MP10 are "low voltage" MOSFETs. The separation between low voltage (LV) and high voltage (HV) is at about 5V, so that LV includes up to about 5V and HV means greater than 5V, such as, for example, 8V or more. In one embodiment, LV is approximately 5V and HV is approximately 15V. In yet another embodiment, LV is up to 5V and HV is up to 75V. Alternative LV and HV combinations are possible and contemplated.

The transistors MP7-MP10 may be configured as normal or standard low voltage MOSFETs. The low voltage transistors MP5 and MP6 are configured with a high threshold and are illustrated in the schematic using a special symbol with a circle at their gate terminals. Low voltage MOSFETs typically have a lower threshold voltage as compared to high voltage MOSFETs. The transistors MP5 and MP6, however, of the differential input stage 100 are configured or otherwise fabricated to have higher than normal threshold voltages that are at least as high as the threshold voltages of the high voltage MOSFETs MP1-MP4 when operating at the same current level.

In one embodiment, the low voltage transistors MP5 and MP6 are configured to have threshold voltages that are greater than the corresponding thresholds of the high voltage transistors MP1-MP4 when operating at the same current level. In one embodiment, the low voltage transistors MP5 and MP6 are configured to have threshold voltages that are at least an offset voltage TH_OFF greater than the corresponding thresholds of the high voltage transistors MP1-MP4 when operating at the same current level. In this case, TH_OFF is not the threshold voltage itself of MP5 and MP6, but represents a threshold voltage difference between MP5 and MP6 as compared to the high voltage MOSFETs MP1-MP4. In one embodiment, for example, TH_OFF is approximately 0.3V, meaning that the threshold voltages of MP5 and MP6 are approximately 0.3V greater than the threshold voltages of the high voltage MOSFETs MP1-MP4.

MP1 and MP5 form a first cascode stage on the positive side, and MP4 and MP6 form a second cascode stage on the negative side of the symmetrically configured differential input stage 100. As shown in FIG. 1 and as described herein, the gates of transistors MP1 and MP5 are connected together at node 114 (INP), and likewise, the gates of transistors MP4 and MP6 are connected together at node 116 (INN). Because of the way they are connected and because of the TH_OFF voltage difference in the threshold voltages of transistors MP5 and MP1, MP5 has a nominal operating source-drain voltage of TH_OFF. Similarly, because of the way they are connected and because of the TH_OFF voltage difference in the threshold voltages of the transistors MP6 and MP4, MP6 has a nominal operating source-drain voltage of TH_OFF. It is desired that these transistors be low current operating in their sub-threshold region.

The high voltage transistors MP2 and MP3 have the same gate-source voltage as MP5 and MP6, and this means they have TH_OFF V more gate drive than the cascode transistors MP1 and MP4. In the normal operating mode of the input stage, transistors MP2 and MP3 operate in the so-called triode region. The additional TH_OFF V of gate drive on transistors MP2 and MP3 results in a low ON resistance and that, in turn, results in a transconductance of the differential input stage that is close to that of a low-voltage input stage in which the sources of MP5 and MP6 are directly connected to each other.

The low voltage transistors MP5 and MP6 are matched to each other providing increased precision. The use of low-voltage transistors, however, means that these transistors need to be protected from high voltages that may exceed their source-to-drain and source-to-gate breakdown voltages. In the cascode configuration, the high voltage transistors MP1 and M4 shield MP5 and MP6, respectively, when operating from a high supply voltage, which would otherwise result in a high source-to-drain voltage for MP5 and MP6. This high voltage instead appears across the source-to-drain connection of the high voltage transistors MP1 and MP4. Similarly, the source-to-gate voltages of the transistors MP5 and MP6 are protected by the back-to-back (drain-to-drain) connected transistors MP2 and MP3, respectively. If the voltage POS is much more positive than the voltage NEG, this large voltage differential appears across the source-to-drain connection of MP2, while transistor MP3 still operates in the triode region. Likewise, if the voltage NEG is significantly more positive than POS, this voltage differential appears across the source-to-drain connections of transistor MP3.

An additional advantage of using the cascode configuration of transistors MP1 with MP5 and MP4 with MP6 is that the voltage gain is much higher due to the cascode operation. The cascode configuration renders the differential input stage 100 relatively insensitive to variations in the common mode input voltage as well as variations in the power supply voltage, giving a 40 decibel (dB) to 60 dB performance improvement compared to a design without a cascode. Also, the use of the cascode means that the accuracy and precision of the differential stage are determined by matching properties of the low-voltage transistors, which are much better than those of the high voltage transistors. In one embodiment, the offset voltage has a 1-sigma value of around 400 µV.

The transistors MP7-MP10, the resistors 101 and 103 and the capacitors 105 and 107 provide protection for the circuit. The resistor 101 and the capacitor 105, and the resistor 103 and the capacitor 107, each form a low-pass filter that limits both input voltage and input current during events such as very fast ESD events. In an alternative embodiment, the capacitors 105 and 107 may be excluded if the parasitic capacitances of the input MOSFETs MP1/MP5 and MP4/MP6 provide sufficient capacitive loading to limit the fast rate of change of the voltage on the internal input nodes 114 and 116, respectively.

In the event of a fast increase in the voltage on the node 106, the voltage on the gate of MP5 might otherwise exceed the voltage on its source by more than the gate-to-source breakdown of the transistor if MP7 were excluded. MP7 clamps the gate-to-source voltage of MP5 to about +0.7V. MP7 has its gate and source terminals connected together, which means it is always operating in the so-called "off" region, but its parasitic drain-to-body diode (having an anode at its drain terminal and a cathode at the commonly connected body/gate/source) provides the clamping action. Likewise, MP8, which also has its gate and source terminals coupled together, is always off but has a parasitic drain-to-body diode which clamps the gate voltage of MP6 to about +0.7V above its source voltage in the event that the voltage on node 108 rapidly increases.

Although MP1 and MP4 are high-voltage transistors, the ability to stand-off a high voltage only applies to the voltage between the source and the drain of the transistors, not to the voltage between the gate and the source. The transistor MP9 protects the gate and source terminals of MP1, and the transistor MP10 protects the gate and source terminals of MP4. MP9 and MP10 each have their gate terminals, source terminals and body or substrate connections coupled together with a parasitic drain-to-body diode providing the clamping function.

Figure 2:
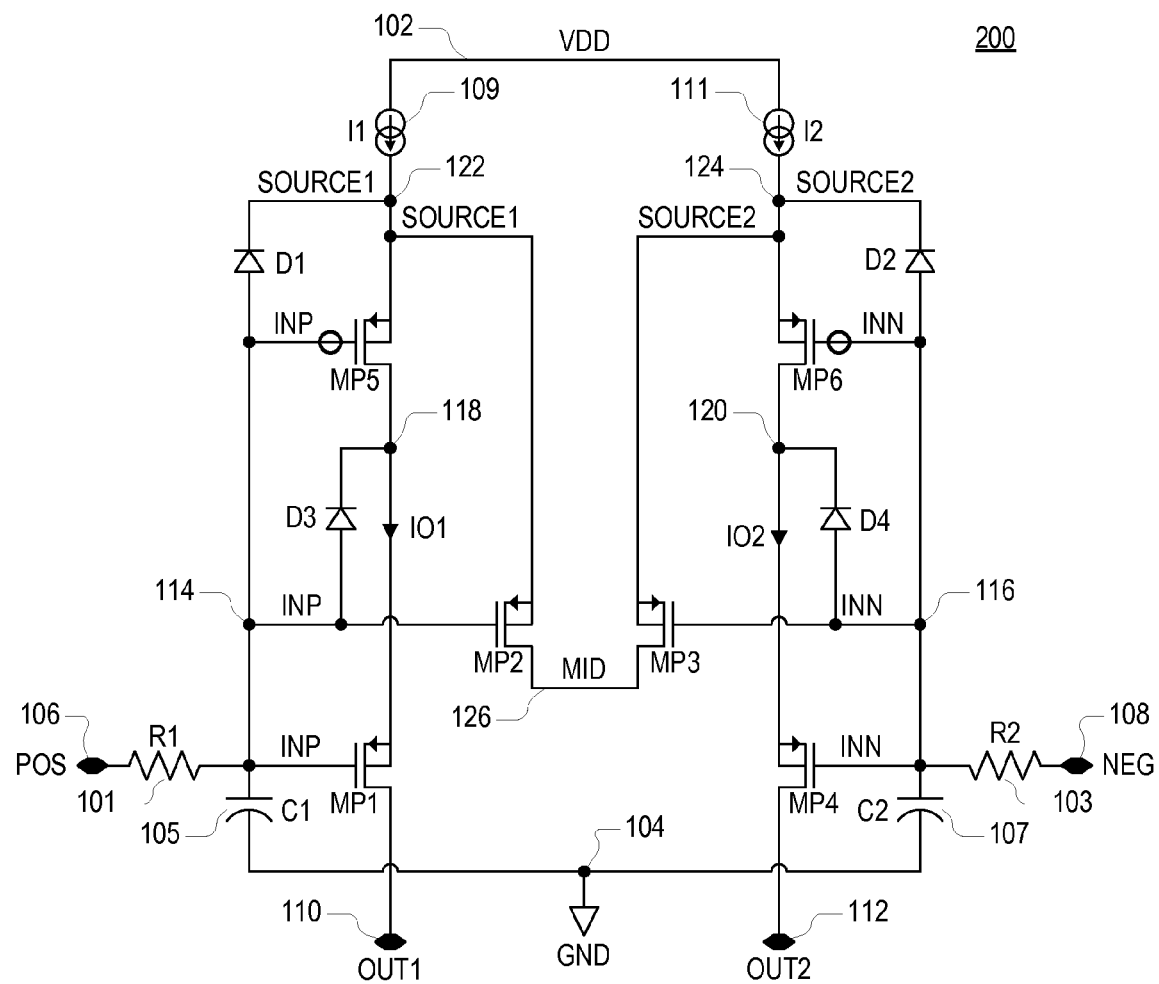
FIG. 2 is a schematic diagram of a precision, high voltage, low power MOSFET differential input stage implemented according to another embodiment of the present invention incorporating input gate protection.

FIG. 2 is a schematic diagram of a precision, high voltage, low power MOSFET differential input stage 200 implemented according to another embodiment of the present invention incorporating input gate protection. The differential input stage 200 is substantially the same as the differential input stage 100, in which similar components assume identical reference numbers. For the differential input stage 200, MP7 is replaced by diode D1 having its anode coupled to node 114 and its cathode coupled to node 122, MP8 is replaced by diode D2 having its anode coupled to node 116 and its cathode coupled to node 124, MP9 is replaced by diode D3 having its anode coupled to node 114 and its cathode coupled to node 118, and MP10 is replaced by diode D4 having its anode coupled to node 116 and its cathode coupled to node 120. Since the transistors MP7-MP10 were coupled to operate in a similar manner as diodes as previously described, the differential input stage 200 has substantially the same function as the differential input stage 100.

Figure 3:
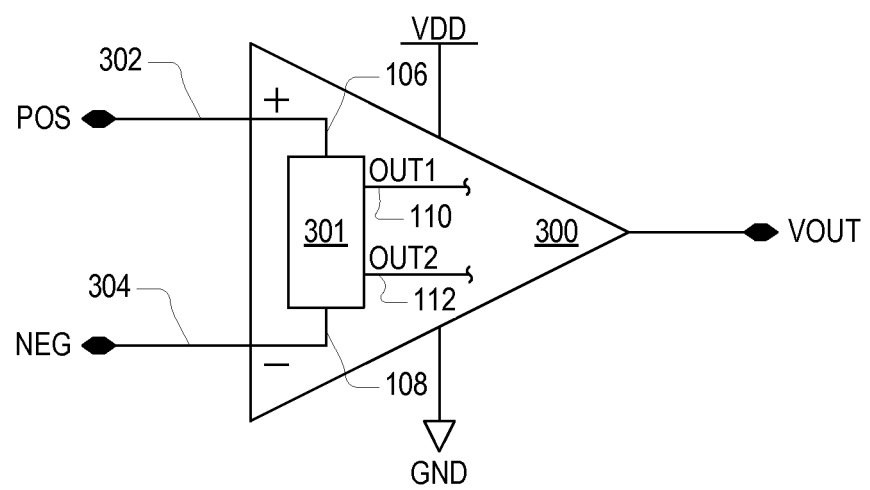
FIG. 3 is a simplified diagram of an amplifying device incorporating a precision, high voltage, low power MOSFET differential input stage, which represents either one of the differential input stages of FIG. 1 or 2.

FIG. 3 is a simplified diagram of an amplifying device 300 incorporating a precision, high voltage, low power MOSFET differential input stage 301, which represents either the differential input stage 100 or the differential input stage 200. The amplifying device 300 represents any type of amplifier or comparator, such as an operational amplifier, transconductance amplifier, comparator, etc. The amplifying device 300 includes a positive (+) or non-inverting input terminal 302 receiving POS and a negative (−) or inverting input terminal 304 receiving NEG internally provided to the input terminals 106 and 108, respectively, of the differential input stage 301. The differential input stage 301 develops output voltages OUT1 and OUT2 on output nodes 110 and 112, respectively, within the amplifying device 300. The amplifying device 300 also has supply inputs for receiving the source voltages VDD and GND. The output portion of the amplifying device 300 is not shown which receives OUT1 and OUT2 and develops a single-ended output VOUT at the output of the amplifying device 300. Although the amplifying device 300 is shown providing a single-ended output, a differential output is also contemplated at the output of the amplifying device 300.

Although the precision, high voltage, low power MOSFET differential input stage 301 is particularly advantageous as the input stage of an amplifying device, such as an amplifier or comparator or the like, it is understood that it may be used for any circuit having a differential input. The precision, high voltage, low power MOSFET differential input stage 301 may be implemented in a discrete circuit or implemented on an integrated circuit (IC) or the like.

Figure 4:
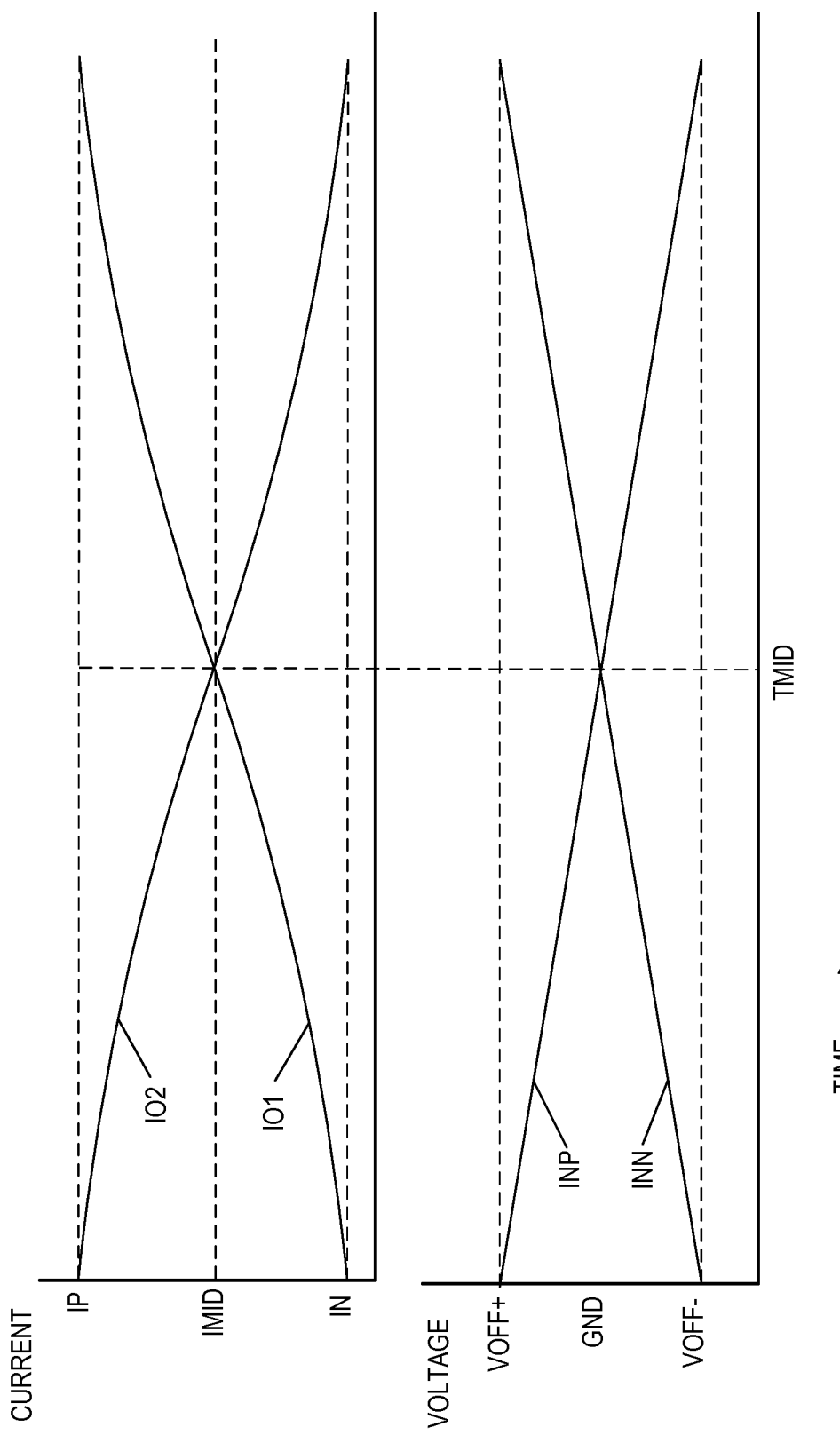
FIG. 4 is a pair of graphic timing diagrams plotting the voltages INP and INN (lower graph) and the corresponding drain currents IO1 and IO2 (upper graph) of transistors MP1 and MP4, respectively, for the differential input stage of FIG. 1 versus time.

FIG. 4 is a pair of graphic timing diagrams plotting the voltages INP and INN (lower graph) and the corresponding drain currents IO1 and IO2 (upper graph) of transistors MP1 and MP4, respectively, for the differential input stage 100 of FIG. 1 versus time. INP is initially set at a predetermined positive offset voltage VOFF+, and INN is initially set at a predetermined negative offset voltage VOFF−, in which the offset voltages have the same magnitude with opposite polarities. INP is then linearly varied from VOFF+ to VOFF− while INN is linearly varied from VOFF− to VOFF+. At a midpoint in time TMID, INP and INN cross each other while each proceeds to the opposite polarity offset voltage.

In response, IO2 begins at a current level IP while IO1 begins at a current level IN, in which IP is greater than IN and IO1 and IO2 are separated by a current offset. IO2 decreases while IO1 increases in which the drain currents become equal to each other at a midpoint current level IMID at the midpoint in time TMID. IO1 continues to increase until it becomes equal to IP when INP has dropped to VOFF−, and I02 continues to decrease until it becomes equal to IN when INN has increased to VOFF+. IO1 and IO2 each have the hyperbolic tangent shape that is well-known to be typical for the currents in differential stages made of bipolar transistors or MOSFETs in sub-threshold operation (gate-source voltage less than the MOSFET threshold voltage). The current levels of IO1 and IO2 each have only a slightly smaller excursion or magnitude as compared to a conventional differential stage. In one embodiment, the excursion of the current levels of IO1 and IO2 are attenuated less than 8% as compared to a conventional differential stage. In one tested configuration, the excursion of the current levels of IO1 and IO2 are attenuated by approximately 7.7% as compared to a conventional differential stage. As a result, the transconductance gain of the differential input stage 100 is only slightly attenuated as compared to a conventional differential stage.

Although there is a slight attenuation of transconductance gain for the differential input stage 100 as compared to a conventional differential stage, the differential input stage 100 is capable of substantially higher voltage operation while maintaining high precision. Also, the differential input stage 100 is capable of low power operation and also provides static and dynamic gate protection. The graphic timing diagrams of FIG. 4 equally applies to the differential input stage 200, which operates and functions in substantially the same manner as the differential input stage 100.

The differential input stages 100 and 200 described herein are shown using P-channel MOSFETs or PMOS transistors, whereas it is contemplated that similar differential input stages may be implemented with N-channel MOSFETs or NMOS transistors as understood by those of ordinary skill in the art. In the N-channel or NMOS configurations, the PMOS transistors are replaced by NMOS transistors, and current sources are reversed. Also, diodes, if used, are reversed. Such P-channel or PMOS to N-channel or NMOS circuit transformations are understood by those of ordinary skill in the art.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A differential input stage, comprising:
   a first input circuit, comprising:
      a first transistor having a first current terminal coupled to a first source node, having a second current terminal coupled to a first cascode node, and having a control terminal coupled to a first internal input node;
      a second transistor having a first current terminal coupled to said first cascode node, having a second current terminal coupled to a first external output node, and having a control terminal coupled to said first internal input node;
      a third transistor having a first current terminal coupled to said first source node, having a second current terminal coupled to an intermediate node, and having a control terminal coupled to said first internal input node;
      a first current source that sources a first bias current to said first source node; and
      a first resistor coupled between a first external input node and said first internal input node; and
   a second input circuit, comprising:
      a fourth transistor having a first current terminal coupled to a second source node, having a second current terminal coupled to a second cascode node, and having a control terminal coupled to a second internal input node;
      a fifth transistor having a first current terminal coupled to said second cascode node, having a second current terminal coupled to a second external output node, and having a control terminal coupled to said second internal input node;

a sixth transistor having a first current terminal coupled to said second source node, having a second current terminal coupled to said intermediate node, and having a control terminal coupled to said second internal input node;

a second current source that sources a second bias current to said second source node; and a second resistor coupled between a second external input node and said second internal input node.

2. The differential input stage of claim 1, wherein said first and fourth transistors are lower voltage transistors as compared to said second, third, fifth and sixth transistors which are higher voltage transistors, and wherein said lower voltage transistors have threshold voltages which are at least as high as threshold voltages of said higher voltage transistors.

3. The differential input stage of claim 1, wherein said first and fourth transistors are configured to match each other.

4. The differential input stage of claim 1, wherein said first, second, third, fourth, fifth and sixth transistors comprise P-channel MOSFETs.

5. The differential input stage of claim 1, further comprising a first capacitor coupled between said first internal input node and a reference supply node, and a second capacitor coupled between said second internal input node and said reference supply node.

6. The differential input stage of claim 1, further comprising a seventh transistor having a first current terminal coupled to said first internal input node and having a second current terminal, a control terminal and a body connection coupled together at said first source node, an eighth transistor having a first current terminal coupled to said second internal input node and having a second current terminal, a control terminal and a body connection coupled together at said second source node, a ninth transistor having a first current terminal coupled to said first internal input node and having a second current terminal, a control terminal and a body connection coupled together at said first cascode node, and a tenth transistor having a first current terminal coupled to said second internal input node and having a second current terminal, a control terminal and a body connection coupled together at said second cascode node.

7. The differential input stage of claim 1, further comprising a first diode having an anode coupled to said first internal input node and having a cathode coupled to said first source node, a second diode having an anode coupled to said second internal input node and having a cathode coupled to said second source node, a third diode having an anode coupled to said first internal input node and having a cathode coupled to said first cascode node, and a fourth diode having an anode coupled to said second internal input node and having a cathode coupled to said second cascode node.

8. The differential input stage of claim 1, wherein said first and second bias currents are substantially equal.

9. The differential input stage of claim 1, wherein said first and fourth transistors are lower voltage transistors as compared to said second, third, fifth and sixth transistors which are higher voltage transistors, and wherein said lower voltage transistors have threshold voltages which are greater than threshold voltages of said higher voltage transistors.

10. The differential input stage of claim 1, wherein said first and fourth transistors are up to 5 Volt transistors and wherein said second, third, fifth and sixth transistors are at least 8 Volt transistors, and wherein said first and fourth transistors have threshold voltages which are greater than threshold voltages of said second, third, fifth and sixth transistors.

11. An amplifying device, comprising:
a differential input comprising a positive input node and a negative input node;
first and second supply nodes; and
a differential input stage coupled to said differential input, comprising:
a first transistor having a first current terminal coupled to a first cascode node, having a second current terminal coupled to a first output node, and having a control terminal coupled to a first internal input node;
a second transistor having a first current terminal coupled to a first source node, having a second current terminal coupled to an intermediate node, and having a control terminal coupled to said first internal input node;
a third transistor having a first current terminal coupled to a second source node, having a second current terminal coupled to said intermediate node, and having a control terminal coupled to a second internal input node;
a fourth transistor having a first current terminal coupled to a second cascode node, having a second current terminal coupled to a second output node, and having a control terminal coupled to said second internal input node;
a fifth transistor having a first current terminal coupled to said first source node, having a second current terminal coupled to said first cascode node, and having a control terminal coupled to said first internal input node;
a sixth transistor having a first current terminal coupled to said second source node, having a second current terminal coupled to said second cascode node, and having a control terminal coupled to said second internal input node;
a first current source coupled to said first supply node and that sources a first bias current to said first source node;
a second current source coupled to said first supply node and that sources a second bias current to said second source node;
a first resistor coupled between said positive input node and said first internal input node; and
a second resistor coupled between said negative input node and said second internal input node.

12. The amplifying device of claim 11, wherein said fifth and sixth transistors are lower voltage transistors as compared to said first, second, third, and fourth transistors which are higher voltage transistors, and wherein said lower voltage transistors have threshold voltages which are at least as high as threshold voltages of said higher voltage transistors.

13. The amplifying device of claim 11, wherein said fifth and sixth transistors are configured to match each other.

14. The amplifying device of claim 11, wherein said first, second, third, fourth, fifth and sixth transistors comprise P-channel MOSFETs.

15. The amplifying device of claim 11, further comprising a first capacitor coupled between said first internal input node said second supply node, and a second capacitor coupled between said second internal input node and said second supply node.

16. The amplifying device of claim 11, further comprising a seventh transistor having a first current terminal coupled to said first internal input node and having a second current terminal, a control terminal and a body connection coupled together at said first source node, an eighth transistor having a first current terminal coupled to said second internal input node and having a second current terminal, a control terminal and a body connection coupled together at said second source node, a ninth transistor having a first current terminal coupled to said first internal input node and having a second current terminal, a control terminal and a body connection coupled together at said first cascode node, and a tenth transistor having a first current terminal coupled to said second internal input node and having a second current terminal, a control terminal and a body connection coupled together at said second cascode node.

17. The amplifying device of claim 11, further comprising a first diode having an anode coupled to said first internal input node and having a cathode coupled to said first source node, a second diode having an anode coupled to said second internal input node and having a cathode coupled to said second source node, a third diode having an anode coupled to said first internal input node and having a cathode coupled to said first cascode node, and a fourth diode having an anode coupled to said second internal input node and having a cathode coupled to said second cascode node.

18. The amplifying device of claim 11, wherein said first and second bias currents are substantially equal.

19. The amplifying device of claim 11, wherein said fifth and sixth transistors are lower voltage transistors as compared to said first, second, third, and fourth transistors which are higher voltage transistors, and wherein said lower voltage transistors have threshold voltages which are greater than threshold voltages of said higher voltage transistors.

20. The amplifying device of claim 11, wherein said fifth and sixth transistors are up to 5 Volt transistors and wherein said first, second, third, and fourth transistors are at least 8 Volt transistors, and wherein said fifth and sixth transistors have threshold voltages which are greater than threshold voltages of said first, second, third, and fourth transistors.

* * * * *